United States Patent [19]
Dodge et al.

[11] Patent Number: 6,025,992
[45] Date of Patent: Feb. 15, 2000

[54] INTEGRATED HEAT EXCHANGER FOR MEMORY MODULE

[75] Inventors: Richard Charles Dodge, Essex Junction; Kenneth Haskell Earl; Gary D. Grise, both of Colchester; Douglas R. Guild, South Burlington; Karl D. Loughner; Jerzy Maria Zalesinski, both of Essex Junction, all of Vt.

[73] Assignee: International Business Machines Corp., Armonk, N.Y.

[21] Appl. No.: 09/249,237

[22] Filed: Feb. 11, 1999

[51] Int. Cl.⁷ ...................................................... H05K 7/20
[52] U.S. Cl. .......................... 361/704; 361/706; 361/717; 361/816; 257/707; 174/35 MS; 165/80.3
[58] Field of Search .................................. 361/702–706, 361/717–719, 749, 783, 816, 818, 683, 694, 691, 794; 257/707–726, 692, 700; 165/80.3, 80.4, 185; 174/252, 262, 254, 16.3, 16.1, 35 TS, 35 MS, 35 R, 138 G; 428/156, 461

[56] References Cited

U.S. PATENT DOCUMENTS

| | | |
|---|---|---|
| 2,112,743 | 3/1938 | Poole . |
| 3,492,535 | 1/1970 | Behrendt ................................. 317/100 |
| 4,130,233 | 12/1978 | Chisholm et al. ...................... 228/126 |
| 4,843,693 | 7/1989 | Chisholm ................................ 29/157.3 |
| 4,888,637 | 12/1989 | Sway-Tin et al. ......................... 357/81 |
| 5,240,789 | 8/1993 | Breen et al. .............................. 429/176 |
| 5,272,599 | 12/1993 | Koenen ................................... 361/710 |
| 5,315,480 | 5/1994 | Samarov .................................. 361/705 |
| 5,358,032 | 10/1994 | Arai et al. ............................... 165/80.3 |
| 5,448,511 | 9/1995 | Paurus et al. .............................. 365/52 |
| 5,526,229 | 6/1996 | Wakabayashi et al. ................. 361/702 |
| 5,653,741 | 8/1997 | Grant ...................................... 607/114 |
| 5,751,553 | 5/1998 | Clayton ................................... 361/749 |

Primary Examiner—Leo P. Picard
Assistant Examiner—Michael Datskovskiy
Attorney, Agent, or Firm—Thornton & Thornton; David R. Thornton; Robert A. Walsh

[57] ABSTRACT

A circuit card unit comprising a memory card and attached heat exchanger comprising a thin, flexible, laminated strip of foil clad plastic, or wire mesh, affixed in thermally conductive contact to each card module and extended therefrom to facilitate removal of heat from the modules. In some embodiments, the exchanger strip extends from the modules on one side of the card to those of the other side in a self supporting, heat exchanger loop spaced over the memory card. In a somewhat more compact embodiment, the strip extends from modules on one card face, along the card itself, to the modules of the other card face. In a still further embodiment, the heat exchanger strip extends from the modules of the card to a heat sink such as the housing of the computer. Additionally, the heat exchanger strips may also function as a carrier for an identifying label printed on, or attached to, the planar surface of the strip.

8 Claims, 5 Drawing Sheets

INTEGRATED HEAT EXCHANGER FOR MEMORY MODULE

FIELD OF THE INVENTION

This invention relates generally to a heat exchanger for computer modules, and more particularly to a conformal, inexpensive heat exchanger for memory modules, and to circuit card units having integrated heat exchangers.

BACKGROUND OF THE INVENTION

Computers use numerous memory units such as Dynamic Random Access Memory units (DRAM)s for the storage of and retrieval of data. Initially, individual memory units were mounted directly onto the computers main board, generally known as the mother board or system board, however, with increased size and complexity, computers and their system boards could not easily accommodate sufficient memory units. An early solution to this problem was to create a memory module, known as Single In-line Memory Module (SIMM), that was formed of a plurality of individual memory units arranged in banks and mounted on a card in electrical connection to terminal pads displayed adjacent a longitudinal edge of the card.

Still higher memory demands in the systems were met by the development of the so-called Dual In-line Memory Modules (DIMMs) having individual memory units mounted on a card in electrical connection to terminal pads displayed adjacent both sides of the pad edge to thereby accommodate increased memory units.

As computers continued to increase in complexity, additional needs such as more memory, greater loading and more compact board design were required. Simultaneously, with these additional needs, users demanded smaller and more portable computers that not only retained the memory capabilities of larger computers but had increased capabilities. To meet these needs and demands, the computer designers required that the memory modules be further enlarged and placed closer together on the carrier board. With increased capacity requirements and miniaturization, the heat generated by individual modules and the packing density of the modules increased.

As is well known in the art, an increase in heat in a semiconductor module or its environs will adversely affect the operating characteristics of the module as well as reduce its operating life. Typically, a memory card having 256 MB (Mega Bytes) of memory generates approximately 15 watts of power which necessitates the dissipation of heat from the modules. Various means for removing excess heat have been presented in the prior art. Typical of such arrangements are the use of air channels and fans for moving cooling air past the modules, or the use of massive bulky, digitated heat sink assemblies which are usually significantly larger than the module to which they are coupled.

These arrangements are not only relatively expensive but also heavy and bulky which require either increased spacing between modules to accommodate the heat sinks or increased air channels, thus requiring larger computer packaging. Moreover, increased module packing density, i.e., 512 MB and 1.0 GB (Giga Byte) module cards, further increases the amount of heat that must be dissipated from the modules while further constricting the space available for heat sinks. Hence all of these factors operate against the desire for more powerful, smaller and more portable computers.

To accommodate these conflicting desires, the computer industry has long sought a lightweight, inexpensive, and easily assembled heat dissipation means that will allow computer modules to be densely packed while still providing the necessary heat dissipation therefrom.

SUMMARY OF THE INVENTION

Broadly, the invention comprises a unique heat dissipation means, heat sink or heat exchanger for semiconductor modules for providing removal of sufficient heat to maintain the modules at an appropriate operating temperature, but without adversely impacting the packing density of the modules or significantly increasing either the weight or cost of the computer.

In the present invention, a novel circuit card unit having a circuit card integrally combined with a flexible, heat exchanger strip comprising a strip of heat conductive material having select surface areas secured in a conformal relationship to a major surface of a card mounted module and extended therefrom. Preferably, the heat exchanger strip is integrally mounted on the circuit card in thermal contact with the modules thereon and with portions thereof extending beyond the circuit card to enhance transfer of heat to the ambient. In an alternate arrangement, the heat exchanger may be extended from the card to a more extensive heat sink.

In one embodiment, the heat exchanger strip extends from the major surfaces of the modules mounted on one side of the circuit card to the modules of the other side, in a self supporting loop configuration spaced from the card so as to facilitate passing of ambient fluid across the heat exchanger. Additionally, portions of the heat exchanger strip are also utilized as support for labeling of the modules.

Accordingly, it is an object of the present invention to provide an electronic module unit having a conformal heat sink affixed thereto.

It is another object of the invention to provide a circuit card unit including a circuit card and an integrated, low cost, flexible heat sink.

It is a further object of the invention to provide a low cost, light weight, flexible heat exchanger configured for easy attachment to card mounted circuit modules.

It is a still further object of the invention to provide an economical light weight, flexible heat exchanger adapted and configured for easy attachment to electronic modules.

These and other objects and features of the present invention will become further apparent from the following description taken in conjunction with the drawings.

DESCRIPTION OF THE PREFERRED EMBODIMENTS

Figure 1:
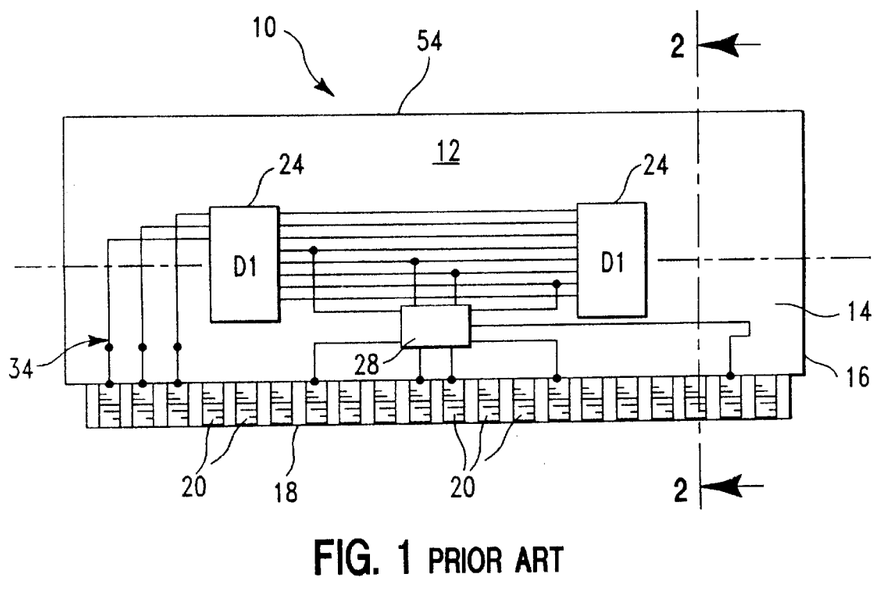
FIG. 1 is a plan view in elevation, schematically illustrating the front face of a DIMM type circuit card of the prior art.
Figure 2:
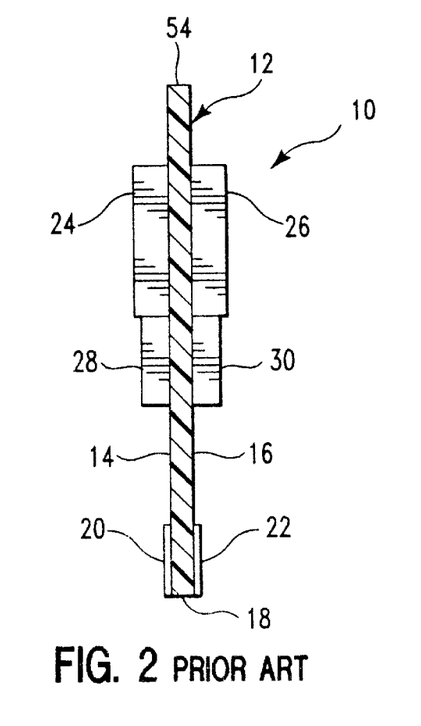
FIG. 2 is a cross sectional view of the circuit card of FIG. 1 taken along the lines 2—2 of FIG. 1.

A first of the preferred embodiments will now be described, with regard to FIGS. 1–4, wherein FIGS. 1 and 2 illustrate a well known memory module type of circuit card 10 having a card body 12, formed in a conventional manner of insulating material. The circuit card 10 has a major front surface, or front face 14 and a major rear surface, or rear face 16. Arranged along a longitudinal edge 18 on both of the front and rear faces 14 and 16 respectively, is a plurality of electrical I/O terminals, or pads 20 and 22.

Carried on each face 14 and 16, respectively, of the card 10 are a plurality of memory modules 24, 26 as well as a support circuits, or support modules 28, 30. In a conventional manner, the modules 24, 26, 28 and 30 are mounted on the card 10 in electrical connection to select ones of the pads 20, 22 along card edge 18 so that the modules will be rendered operational when the edge 18 is inserted in, and enabled by an appropriate mother board socket.

In a typical circuit card, such as a DIMM card, each of the faces 12 and 14 of the circuit card will carry eight memory modules, of which only a representative two, designated D0 and D7, are shown in FIG. 1. As shown therein, the memory modules 24 carried on the front face 14 of the card are connected by a group of wires, or conductors 34 to select respective pads 20, 22 at the edge 18 and to the support module 28. Similarly on the rear face 16 of the card 10, modules 26 are connected by a group of conductors, not shown, to the support module 30 and select ones of the pads 20, 22 at the edge 18.

The memory modules 24, 26 are conventional memory DRAM circuits intended for operation in a usual manner in accordance with a standard electrical circuit board configuration, as is well known to the art. To this end, the edge 18 is designed to fit a standard DIMM memory socket 36, diagrammatically illustrated in FIG. 4.

Figure 3:
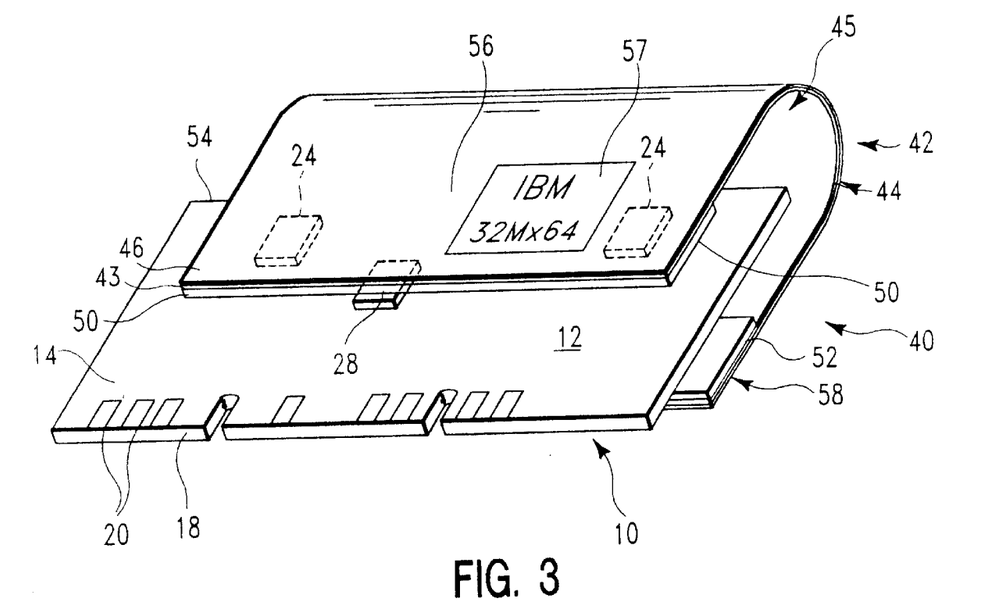
FIG. 3 is a view in perspective of a circuit card unit comprising a prior art memory card as depicted in FIG. 1, integrally combined with a laminated, flexible, heat exchanger provided in accordance with a first embodiment of the present invention.
Figure 4:
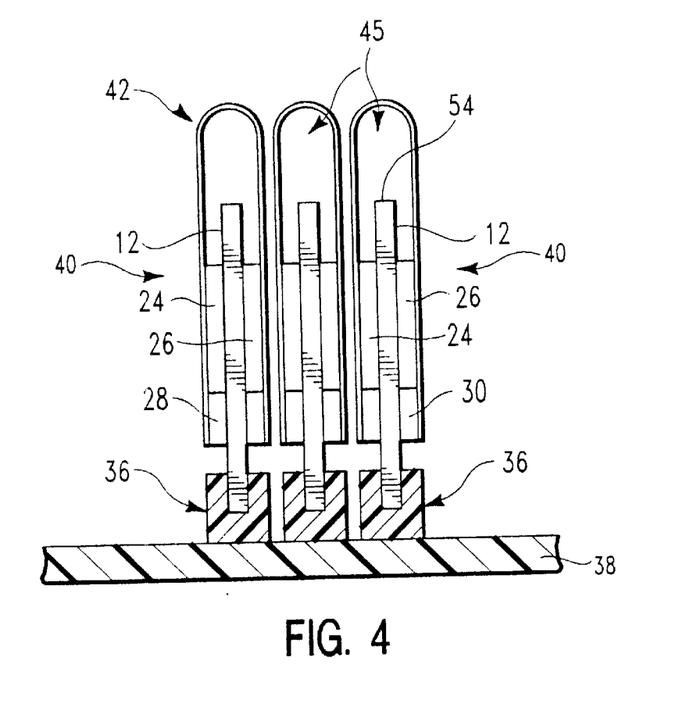
FIG. 4 is an end view of several of the circuit card units illustrated in FIG. 3, arranged in an operative manner on a computer mother board.

Turning now to FIGS. 3 and 4, wherein a first of the preferred embodiments is shown, a circuit device, or circuit card unit 40 is illustrated as utilizing the card 10 in combination with a heat exchanger 42, constructed in accordance with the invention. As shown in FIGS. 3 and 4, the card unit 40 is illustrated with the card 10 integrally combined with a heat exchanger 42 which is affixed to the modules 24, 26, 28 and 30 of the card. In FIG. 3, two of the modules 24 and the module 28 are shown in dotted outline.

In FIG. 4, a plurality of circuit card units 40, as illustrated in FIG. 3, are shown mounted on a computer mother board 38. In this figure, each of the circuit cards units 40 has its pad edge 18 inserted in a respective DIMM memory socket 36, a plurality of which are coupled to the mother board 38.

In this preferred first embodiment, the heat exchanger 42 is formed as a laminated ribbon, or strip 44 comprising, for example, 0.003 inch thick polyimide tape 43, clad or coated with a metal layer, or metal foil 46. For example, the foil 46 may comprise so called 2 ounce copper, having a thickness of 0.0028 inches. Additionally, a pair of adhesive layers 50 and 52 are carried on the underside of the heat exchange strip 44, in first and second areas 56, 58 located at opposite ends of the strip. These adhesive layers 50 and 52 are formed of a thermally conductive adhesive for securing the ends of the heat exchanger 42 to the card modules on both of the card faces 14 and 16.

Each of the adhesive layers 50 and 52, preferably comprise a layer of 0.002 inch thick thermally conductive adhesive, such as a thermally conductive epoxy as, for example, that sold under the trade name Ablestick 566 k. Hence, the heat exchanger 42 comprises a laminated, copper clad polyimide strip 44, coated with adhesive in at least the area of attachment to the modules of a circuit card 10.

As seen in FIGS. 3 and 4, the heat exchanger 42 is fixed in an arch or loop 45 around, and spaced from, the longitudinal card edge 54 opposite the card edge 18 along which pads 20 are located. In this embodiment, the first area 56 of the heat exchanger 42 is affixed to the modules 24 and 28 on the front face 14 of the card 10, and the second area 58 is affixed to the modules 26 and 30 on the rear face 16 of the card. The remainder of the heat exchanger 42 extends as the loop 45 in an arched configuration. This loop increases the exposed area of the heat exchanger and thus facilitates cooling of the latter and its attached memory modules.

For conventional DIMM memory cards, the width of the heat exchanger strip is about five inches and its length is at least four inches, such that an area exceeding 20 square inches is provided. The copper foil can also be etched to increase the exposed area to 40 square inches, or more, which will easily provide adequate cooling of the memory module cards.

In the method of construction, a strip 44 of copper clad polyimide is cut from a reel (not shown) of the copper and polyimide laminate in a width to at least accommodate the length of the line of memory modules 24 and 26 and in a length sufficient to provide an arched loop appropriate to dissipate sufficient heat from the card modules. To affix the heat exchanger 42 to the modules, adhesive layers 50 and 52, having a length approximating the width of the heat exchanger 42, are also deposited across the underside of the composite strip 44, adjacent its respective end areas 56, 58.

Subsequently, these end areas 56, 58 of the heat exchanger 42 are affixed to the modules 24, 28 and 26, 30, respectively, of both card faces 14 and 16 by pressing these end areas and their adhesive layers 50, 52 against the upper surfaces of the underlying modules on one and the other face of the card 10. This affixes the heat exchanger 42 to at least one of the major surfaces of each of the card mounted modules 24, 26, 28 and 30 on both card faces 14, 16 in a manner to provide good thermal contact between the heat exchanger and the modules.

The integration of the heat exchanger 42 and card 10 provides a card unit 40 which allows its straight forward insertion and replacement, as is common with prior art memory circuit cards. Moreover, in some applications, the integrated aspects of the card unit 40 will also allow upgrade of present memory card design to a circuit card unit providing higher power modules.

It is to be understood that the flexible, yet self-sustaining aspects of the heat exchanger 42 provides a free standing, integrated circuit card unit 40, including its own economical heat sink designed to limit module temperature. Consequently, the laminated, heat exchanger strip 44 results in an economical, easily attached heat exchanger providing good contact with the card modules even when the latter have some variations in relative height.

Advantageously, the strip 44 utilizes the polyimide tape 43 as a carrier for the thermally conductive, copper foil 46 to provide an easily configured, economical heat exchanger. It is noted, however, that the polyimide tape 43 which is of relatively low thermal conductivity as compared to the copper foil, is interposed between the foil and the adhesive layers 50, 52. Now, while this arrangement might be expected to reduce heat transmission from the modules to the foil 46, it should be noted that only the 0.002 inch thickness of polyimide is interposed between it and the adhesive such that the reduction in heat transmission is rather slight. Consequently, for most applications, sufficient heat will generally be transmitted to the foil 46 to maintain the temperature of the modules within their specified temperature range.

Where a greater exchange of heat is desired, the thermal conductivity of the polyimide tape 43 can actually be raised in the area of attachment to the card modules, so as to increase thermal transmission to the copper foil 46. For example, the polyimide may include holes (not shown) to allow plating of the copper through the polyimide 43, or alternatively, to allow some of the adhesive to extend into the holes so as to make contact with portions of the foil 46. Both ends of the heat exchanger 42 may also be folded under for direct adhesive contact of the foil 46 to the modules. Further, the foil 46 could also be applied to both surfaces of the polyimide strip 43 so as to improve the contact to the modules as well as to improve heat exchange cooling.

Advantageously, the metal clad tape 44 also provides a suitable surface available for printing of, or attachment of module identifying labels. That is, the heat exchanger 42 provides a suitable surface, such as the foil 46, for receiving identification of the particular memory card, or circuit card unit. Thus, as illustrated in FIG. 3, an identifying label 57 is printed on, or attached to the foil 46 of the circuit unit 40. Consequently, the heat exchanger functions for both removal of excess heat and as an appropriate carrier for an identifying label.

Figure 5:
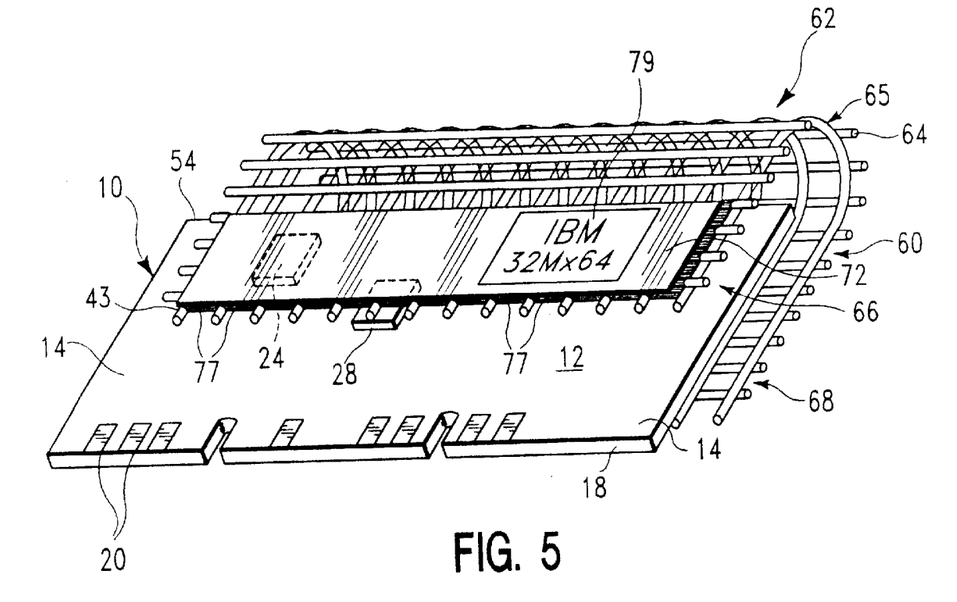
FIG. 5 is a view in perspective of a circuit card unit having a card as depicted in FIG. 1 combined with a mesh type heat exchanger strip in accordance with a second embodiment of the present invention.

Turning now to the second of the preferred embodiments, a circuit card unit 60 is illustrated in perspective in FIG. 5, as having a circuit card 10 in combination with an open mesh heat exchanger 62. In this embodiment, the heat exchanger 62 is preferably formed as a ribbon or strip of metal wire screen, or wire mesh 64, constructed of copper wire woven in any conventional open weave, for example. However, other forms of a screen or mesh, such as expanded metal, may also be usefully employed. It should also be noted that both the flexibility of the mesh strip 64 and its open weave contribute to its heat exchange characteristics as well as to providing good thermal contact to the card modules.

Figure 6:
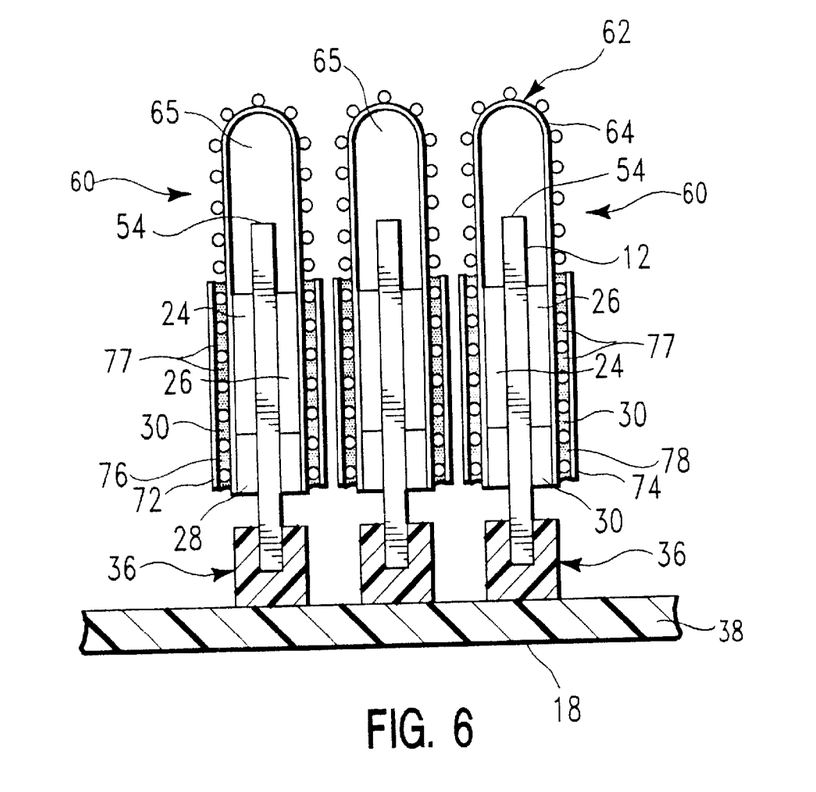
FIG. 6 is an end view of several of the circuit card units of the type illustrated in FIG. 5, arranged in an operative manner on a computer mother board.

As illustrated in FIG. 6, a plurality of circuit card units 60, each including a circuit card 10 and a heat exchanger 62, are mounted on a computer mother board 38 with each of the card units having its edge 18 inserted in a respective DIMM memory socket 36, a plurality of which are coupled to the mother board.

In a manner somewhat similar to the previously described first embodiment, a first end portion 66 and a second end portion 68 of the mesh strip 64 are adhesively secured to the modules 24, 28 and 26, 30 of the card faces 14 and 16, respectively, with the heat exchanger 62 configured in an arched arrangement above the card to form an open loop 65. Thus, the heat exchanger 62 extends in a spaced arrangement from the modules on the card face 14 over the card edge 54 to the modules on the card face 16.

As subsequently explained in more detail in regard to assembly of the card unit 60, the first end portion 66 of the mesh strip 64 is affixed by thermally conductive adhesive to the circuit modules 24 and 28 on the card face 14, and the second end portion 68 similarly affixed to the circuit modules 26 and 30 on the rear face 16. In turn, the remainder of the heat exchanger 62 extends in spaced relation over the card edge 54 thereby providing an open mesh loop 65 for facilitating passage of cooling air both across and through the loop 65.

It should be understood that the mesh 64 can be provided by many different wire sizes and weaves so long as they provide good thermal conductivity and a flexible, but self supporting ribbon.

In this, the second embodiment of the invention, the heat exchanger 62 is preferably assembled to the card modules by the means of adhesive carrying, polyimide strips 72 and 74. A mesh strip is first prepared in a width to accommodate the successive line of modules on the card 10 and in a length sufficient to provide a length of loop appropriate for dissipating sufficient heat from the circuit card modules. Then, polyimide strips 72, 74, cut to a length and width approximating the area of the modules, are prepared with the underside of each strip carrying a layer 76, 78 respectively, of a thermally conductive adhesive, such as the thermally conductive epoxy described for the first embodiment.

In one method of assembly of the circuit card unit 60, the strips 72 and 74 are positioned on the end portions 66 and 68 of the mesh 64, and the latter, in turn, placed on the modules carried by the card faces 14 and 16, respectively. To complete the card unit 60, the polyimide strips 72 and 74 are then pressed against the end portions 66 and 68 of the mesh 64 to force much of the thermally conductive adhesive layers 76, 78 through the open weave and into contact with the modules, as shown at 77 in FIG. 5.

This assembly technique secures the end portions 66 and 68 in good thermal contact with their respective modules 24, 26, 28 and 30. Hence, the operation affixes the heat exchanger 62 to at least one of the major surfaces of each of the modules. Advantageously, both of the strips 72, 74 also provide suitable planar surfaces for carrying identification of the particular memory card of the module unit. Thus, as illustrated in FIG. 5, an identifying label 79 is printed on, or attached to the strip 72.

The thermally conductive adhesive can also be applied to the mesh 64 in other arrangements without the use of the polyimide strips 72 and 74. For example, the adhesive can be simply deposited in the open weave of the end portions 66 and 68. In the latter arrangement, however, since a printing surface will not be available on the heat exchanger, a separate label could be affixed to the mesh.

As described in both the above noted embodiments, the heat exchangers 42 and 62 of the respective circuit card units 40 and 60, are preferably looped above their circuit cards so as to provide both a large heat exchange area and to appropriately present at least the loop portions 45 and 65 of these elements to the ambient. Thus, the vertical looping of the exchangers 42 and 62 provides an economical, compact, circuit card unit which utilizes the available height in a computer package and the usual air flow therein to provide a suitable heat exchange.

It should also be understood, that large area, self sustaining loops, similar to the loops 45 and 65, can be constructed from two separate heat exchange strips similar to those forming heat exchangers 42 and 62. In the latter arrangement (not shown), one end of each of the separate strips would be affixed to the modules on opposite faces of the card respectively, and their other ends joined together to provide an extended self sustaining arch or loop of large heat exchange area.

Still other arrangements of the heat exchangers 42 and 62 can also be utilized. To conserve height above the card, the loops 45 and 65 could be extended at varied angles to the longitudinal card edge 54 such as, for example, at an angle of approximately forty five degrees. Moreover, the heat exchanger loops can even be extended over one of the lateral side edges of the circuit card 10, rather than above its longitudinal edge 54. The latter could be useful, of course, in applications where lateral area, rather than height, is available in the package.

Figure 7:
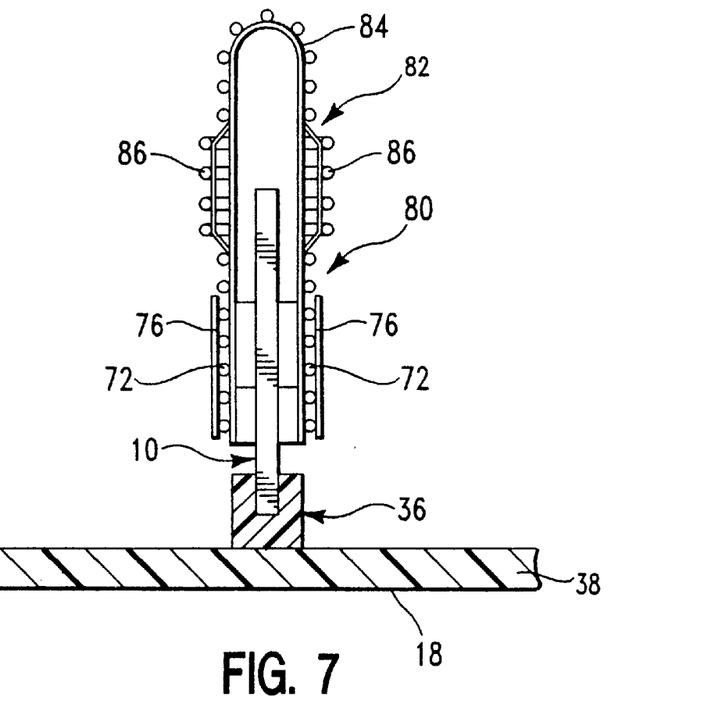
FIG. 7. is an end view of a circuit card as is illustrated in FIG. 1, arranged on a computer mother board in combination with a mesh type heat exchanger in a third embodiment of the invention.

In a third embodiment of the invention, as illustrated in FIG. 7, a circuit card unit 80 comprises a combination of the circuit card 10 and a mesh type heat exchanger 82 having a free loop 84 which carry a plurality of protrusions, dimples or ripples, two of which are shown at 86. Such ripples 86 increase the heat exchange area and also additionally provide an increased cross sectional area protruding into the path of the cooling air stream. As illustrated in FIG. 7, the ripples 86 are aligned in the direction of the loop 84, however, it should be realized that the mesh could alternatively be dimpled or rippled (not shown) normal to the direction of the loop 84.

Figure 8:
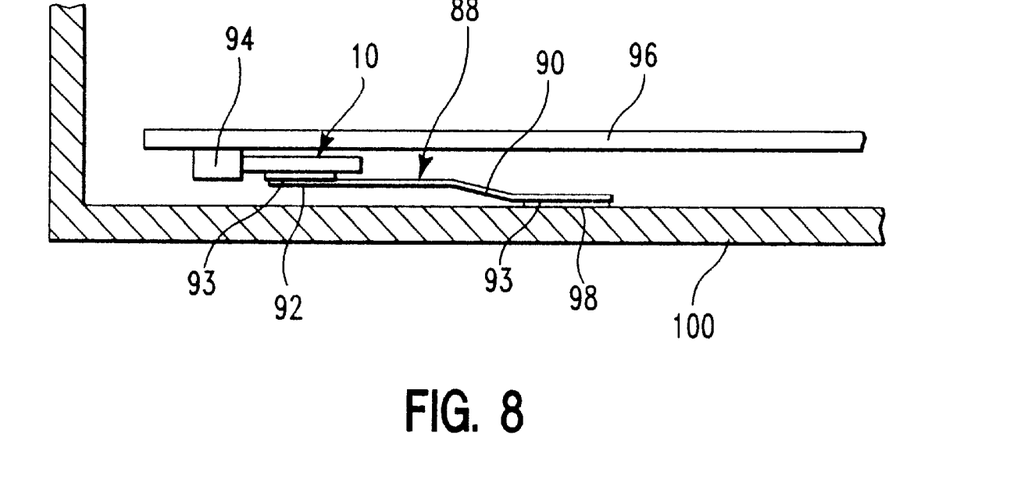
FIG. 8 is a side view of a circuit card unit having a memory card as is illustrated in FIG. 1, arranged on a computer mother board in combination with an extended heat exchanger strip.

The foil clad strip 44 of the embodiment shown in FIGS. 3 and 4, or the mesh strip 64 of FIGS. 5, 6 and 7, can also be utilized to carry module heat to a conventional sink in the computer package. Thus in a fourth embodiment, as illustrated in FIG. 8, a circuit card 95 (which is similar to the circuit card 10 but carries modules on only one face) is shown in connection to a card socket 94 of a mother board 96. In this arrangement, a thin flexible heat exchanger strip 88 comprising a copper clad plastic laminate or strip 90, identical to the laminated strip described in the first embodiment, is affixed at one end 92 by thermally conductive adhesive 89 to modules 93 of a circuit card 95. At its other end 98, the heat exchanger strip 88 extends to, and is affixed by thermally conductive adhesive 99 to, the metal computer case, or computer box 100 which act as appropriate heat sinks. Alternatively, the heat exchanger 88 can extend to any conventional heat sink (not shown) within the computer box.

Further, while the heat exchanger 88 is illustrated in FIG. 8 as thermally coupled to only one side of its circuit card 95, it should be appreciated that the card 10 could also be utilized with a pair of heat exchangers 88 extended from opposite faces of the card to an appropriate heat sink. Moreover, the loop arrangements of FIGS. 3 to 7 can also be employed for attachment to a heat sink as just described above. For example, a portion of a heat exchanger loop may be thermally affixed to the computer box 100, or other heat sink (not shown), to additionally enhance the efficiency of these heat exchangers.

Figure 9:
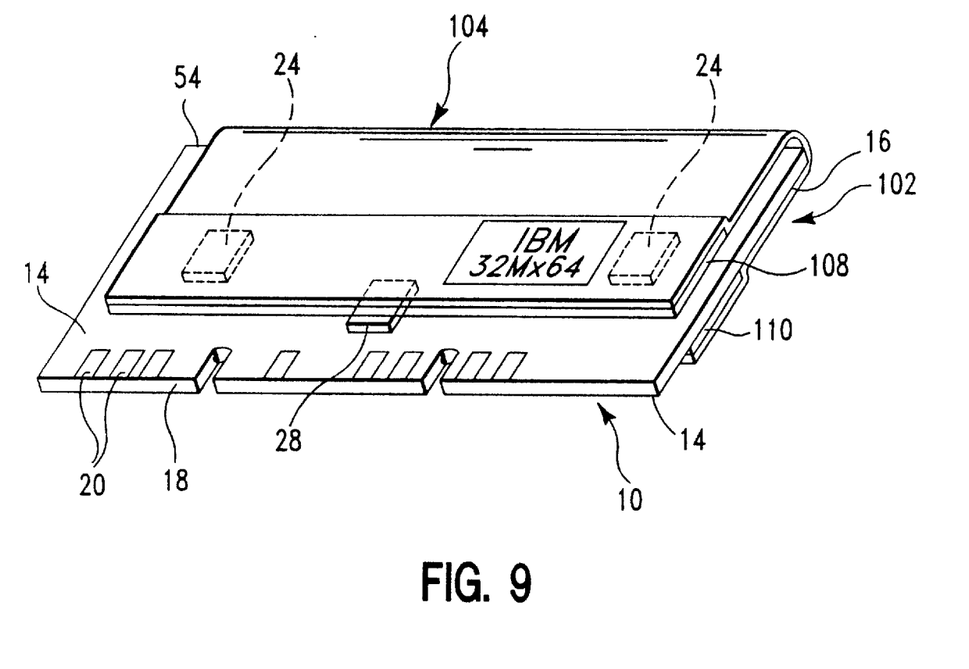
FIG. 9 is a perspective view of another embodiment of the invention wherein a heat exchanger strip extends along both faces of the circuit card.

In a fifth embodiment illustrated in FIG. 9, a circuit card unit 102 is illustrated with a heat exchanger 104 extended along one face 14 of the card 10 to the other face 16. In this embodiment, the heat exchanger 104 comprises a laminate strip 106, identical to the laminate described in the first embodiment. Herein, the heat exchanger 104 is affixed by a thermally conductive adhesive layers 108 to the modules 24 and 28 on face 14 of the card 10, and extends therefrom along this face to the card edge 54. At the edge 54, the heat exchanger 104 then continues to, and along the card face 16 and, by means of a thermally conductive adhesive layer 110, into attachment with the modules 26 and 30 (not shown in this figure). This embodiment, while similar to the first preferred embodiment, provides a more compact circuit card unit 102 in that the heat exchanger 104 is retained close to the card edge 54 as it passes around this edge to the other side of the card 10. While this arrangement will result in some reduction in the area of the heat exchanger and thus, the thermal efficiency of unit 102 as compared to the open loop embodiments, it can be utilized where packaging density is vital.

As in the first embodiment, the heat exchanger 104 also provides a suitable surface for carrying identification of the module unit. Thus, an identifying label 110 is printed on, or attached to, the laminate strip 106 as shown in this figure.

Hence, it should be understood that each of the described embodiments provide an efficient, low cost means of dissipating heat from card mounted electronic modules, and that while a heat exchanger comprising a laminated plastic strip may be more easily utilized in manufacturing integrated circuit card units, a mesh arrangement can also be useful. Moreover, while the heat exchangers of the preferred embodiments are described herein with regard to providing novel circuit card units, these can also provide economical heat exchanger arrangements in some instances for discrete electronic modules, mounted other than on circuit cards. Thus, individual modules, as well as other types of modular units could also utilize the loop arrangements depicted in FIGS. 3–7.

The heat dissipation devices of the present invention are considerably less expensive and lighter in weight that the heat dissipation solutions known to the prior art. Furthermore, the present invention is simpler to affix to the modules or memory cards than units known to the prior art.

Thus, the present invention, results in a low cost, flexible heat exchanger element and in an improved circuit card unit in which heat can be efficiently extracted from the modules without substantially diminishing or adversely affecting the packing density of the circuit cards within a computer, and additionally can provide an appropriate labeling surface.

This completes the description of the preferred embodiments of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications, will now become apparent to those skilled in the art without departing from the spirit and scope of the invention as set forth in the following claims.

What is claimed is:

1. A circuit device comprising:
   a printed circuit card having a substantially planar card body comprised of insulative material and having a plurality of pads mounted along at least one edge thereof, said card having a pair of major surfaces and at least one electronic module mounted on each of said major surfaces in connection to one or more of said pads; and
   a heat exchanger including a flexible, thermally conductive strip having a first area affixed in thermally conductive contact to a surface of at least one electrical module on one of said major surfaces and a second area affixed in thermally conductive contact to a surface of at least one electrical module on the other of said major surfaces, said strip extending from its attachment to at least one module on said one major surface in spaced relation around a given edge of said card and into attachment to at least one module of said other major surface, and said strip being spaced from said given edge in an arched arrangement forming an open loop portion beyond said given edge so as to increase the area of said strip exposed to the ambient and to facilitate cooling of both sides of said strip in said open loop portion.

2. The circuit device of claim 1 wherein said thermally conductive strip comprises a flexible metal mesh.

3. The circuit device of claim 1 wherein said thermally conductive strip comprises a strip of polyimide material laminated on at least one said thereof with a metal layer.

4. The circuit device of claim 1 wherein said thermally conductive strip comprises an open metal mesh, said open metal mesh being attached to said modules by thermally conductive adhesive, and said thermally conductive adhesive is carried by a pair of plastic strips respectively positioned over each area of attachment of said mesh to said modules in a manner to force the adhesive through the openings in said mesh and into contact with the underlying module.

5. The heat exchanger of claim 4 wherein a card identifying label is carried on at least one of said plastic strips.

6. The circuit device of claim 1 wherein said thermally conductive strip has a pair of major surfaces, and said thermally conductive strip extends from attachment to modules on said first major surface of said card to modules of said second major surface of said card with said major surfaces of said strip extending along said card and close to the apex of said loop in generally parallel relation to the major surfaces of said card to thereby provide a large exposed area to facilitate cooling of the attached modules while minimizing the increase in cross sectional thickness of said circuit device.

7. The circuit device of claim 1 wherein said card is generally rectangular in shape and said given edge of said card is a card edge other than said one edge.

8. The circuit device of claim 1 wherein said card is generally rectangular in shape and said given edge of said card is a card edge opposite said one edge.

* * * * *